United States Patent
Behling et al.

(10) Patent No.: US 6,570,765 B2
(45) Date of Patent: May 27, 2003

(54) OVER-VOLTAGE PROTECTION FOR ELECTRONIC CIRCUITS

(76) Inventors: Gerald R. Behling, 15109 Nob Hill Dr., San Jose, CA (US) 95127; James B. Intrater, 592 Mill Creek La. #316, Santa Clara, CA (US) 95054

( * ) Notice: Subject to any disclaimer, the term of this patent is extended or adjusted under 35 U.S.C. 154(b) by 0 days.

(21) Appl. No.: 10/013,952

(22) Filed: Dec. 13, 2001

(65) Prior Publication Data

US 2002/0070838 A1 Jun. 13, 2002

Related U.S. Application Data

(62) Division of application No. 09/548,904, filed on Apr. 13, 2000.

(51) Int. Cl.[7] ................................................. H05K 7/20
(52) U.S. Cl. ........................ 361/720; 361/761; 361/762; 361/726; 332/201; 332/204
(58) Field of Search ................................ 361/726, 761, 361/722, 762, 771, 780, 793, 794, 799, 773, 776, 760; 332/204, 201

(56) References Cited

U.S. PATENT DOCUMENTS

| 3,648,364 A | 3/1972 | Endo |
| 3,685,026 A | 8/1972 | Wakabayashi et al. |
| 4,103,274 A | 7/1978 | Burgess et al. |
| 4,298,416 A | 11/1981 | Casson et al. |
| 4,483,973 A | 11/1984 | Lucas et al. |
| 4,486,738 A | 12/1984 | Sadlo et al. |
| 4,499,234 A | 2/1985 | Pratt et al. |
| 4,514,529 A | 4/1985 | Beers et al. |
| 4,523,001 A | 6/1985 | Swiger et al. |
| 4,532,419 A * | 7/1985 | Takeda ........................ 235/492 |
| 4,554,338 A | 11/1985 | Wengrovius |
| 4,563,498 A | 1/1986 | Lucas |
| 4,580,794 A | 4/1986 | Gibbons |
| 4,726,991 A | 2/1988 | Hyatt et al. |
| 4,729,752 A | 3/1988 | Dawson, Jr. et al. |

(List continued on next page.)

Primary Examiner—David Martin
Assistant Examiner—Hung Bui
(74) Attorney, Agent, or Firm—Burns, Doane, Swecker & Mathis, LLP

(57) ABSTRACT

Over voltage protection is provided for electronic circuits by disposing one or more ground bars for diverting harmful currents away from the sensitive electronic circuit elements. The ground bars are each associated with a row of contact portions of the electronic circuit. Microgaps between each contact portion and the corresponding ground bar are designed to provide an electrical conduit from the contact portion to the ground bar when normal operating voltages are exceeded, thereby channeling excess current harmlessly to ground. Under normal operating conditions, however, the microgaps act as electrical barriers, insulating the contact portions from ground. The microgaps may be filled with any combination of air, vacuum, or known variable voltage material.

8 Claims, 3 Drawing Sheets

U.S. PATENT DOCUMENTS

| | | |
|---|---|---|
| 4,788,523 A | 11/1988 | Robbins |
| 4,928,199 A | 5/1990 | Diaz et al. |
| 4,977,357 A | 12/1990 | Shrier |
| 5,008,770 A | 4/1991 | Hilland |
| 5,089,929 A | 2/1992 | Hilland |
| 5,099,380 A | 3/1992 | Childers et al. |
| 5,130,881 A | 7/1992 | Hilland |
| 5,142,263 A | 8/1992 | Childers et al. |
| 5,183,698 A | 2/1993 | Stephenson et al. |
| 5,189,387 A | 2/1993 | Childers et al. |
| 5,194,010 A | 3/1993 | Dambach et al. |
| 5,197,891 A | 3/1993 | Tanigawa et al. |
| 5,216,404 A | 6/1993 | Nagai et al. |
| 5,246,388 A | 9/1993 | Collins et al. |
| 5,248,517 A | 9/1993 | Shrier et al. |
| 5,260,848 A | 11/1993 | Childers |
| 5,262,754 A | 11/1993 | Collins |
| 5,294,374 A | 3/1994 | Martinez et al. |
| 5,340,641 A | 8/1994 | Xu |
| 5,342,220 A | 8/1994 | Kodama |
| 5,393,597 A | 2/1995 | Childers et al. |
| 5,483,407 A | 1/1996 | Anastasio et al. |
| 5,674,083 A | 10/1997 | Whiteman, Jr. et al. |
| 5,796,570 A | 8/1998 | Mekdhanasarn et al. |
| 6,178,339 B1 * | 1/2001 | Sakai et al. .................. 333/126 |
| 6,239,687 B1 | 5/2001 | Shrier et al. |
| 6,310,752 B1 * | 10/2001 | Shrier et al. ................... 361/56 |

\* cited by examiner

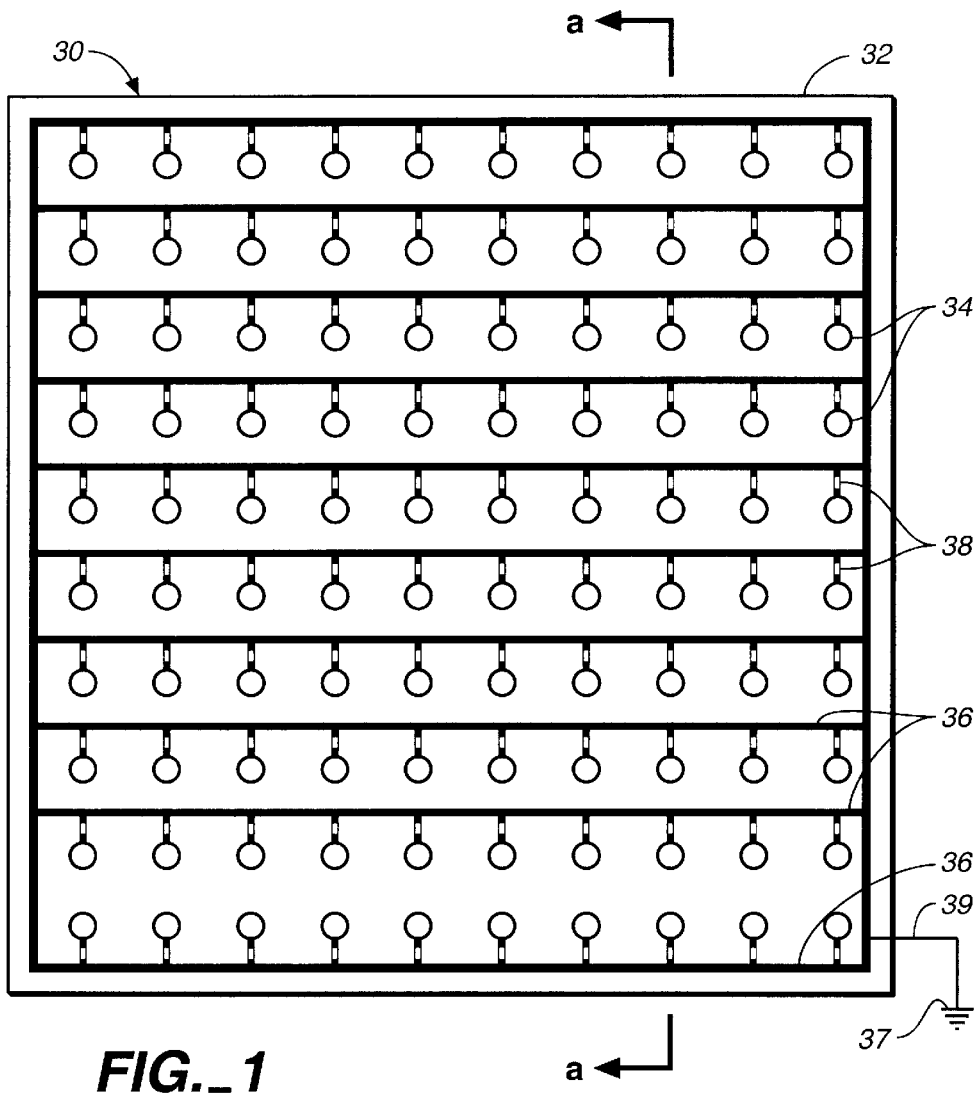
FIG._1

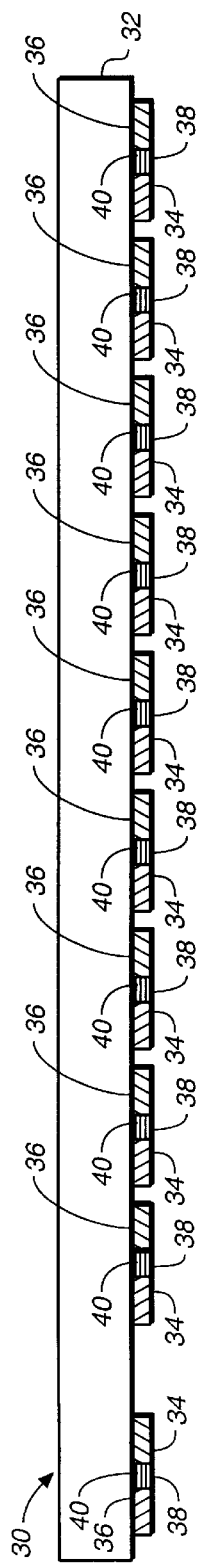
FIG._2
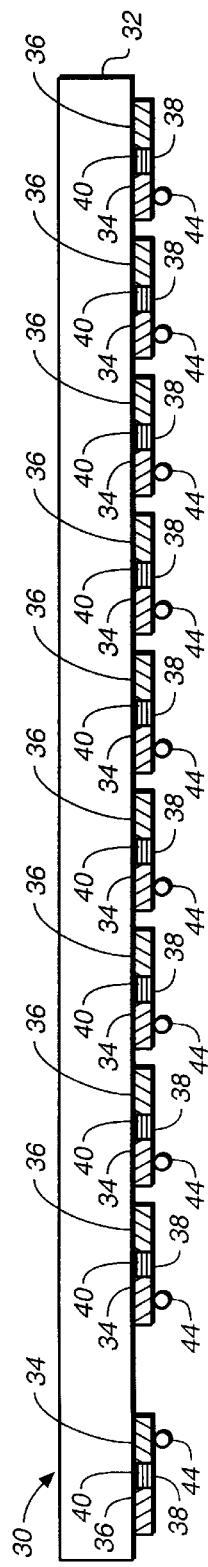
FIG._3
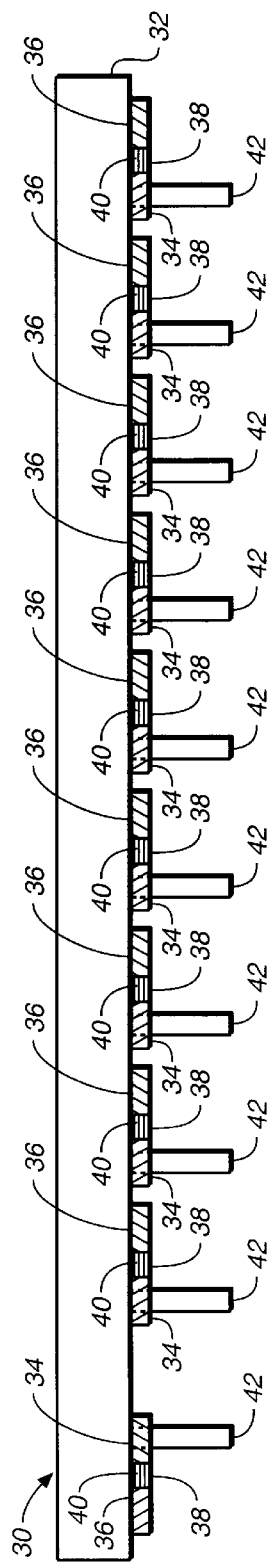
FIG._4

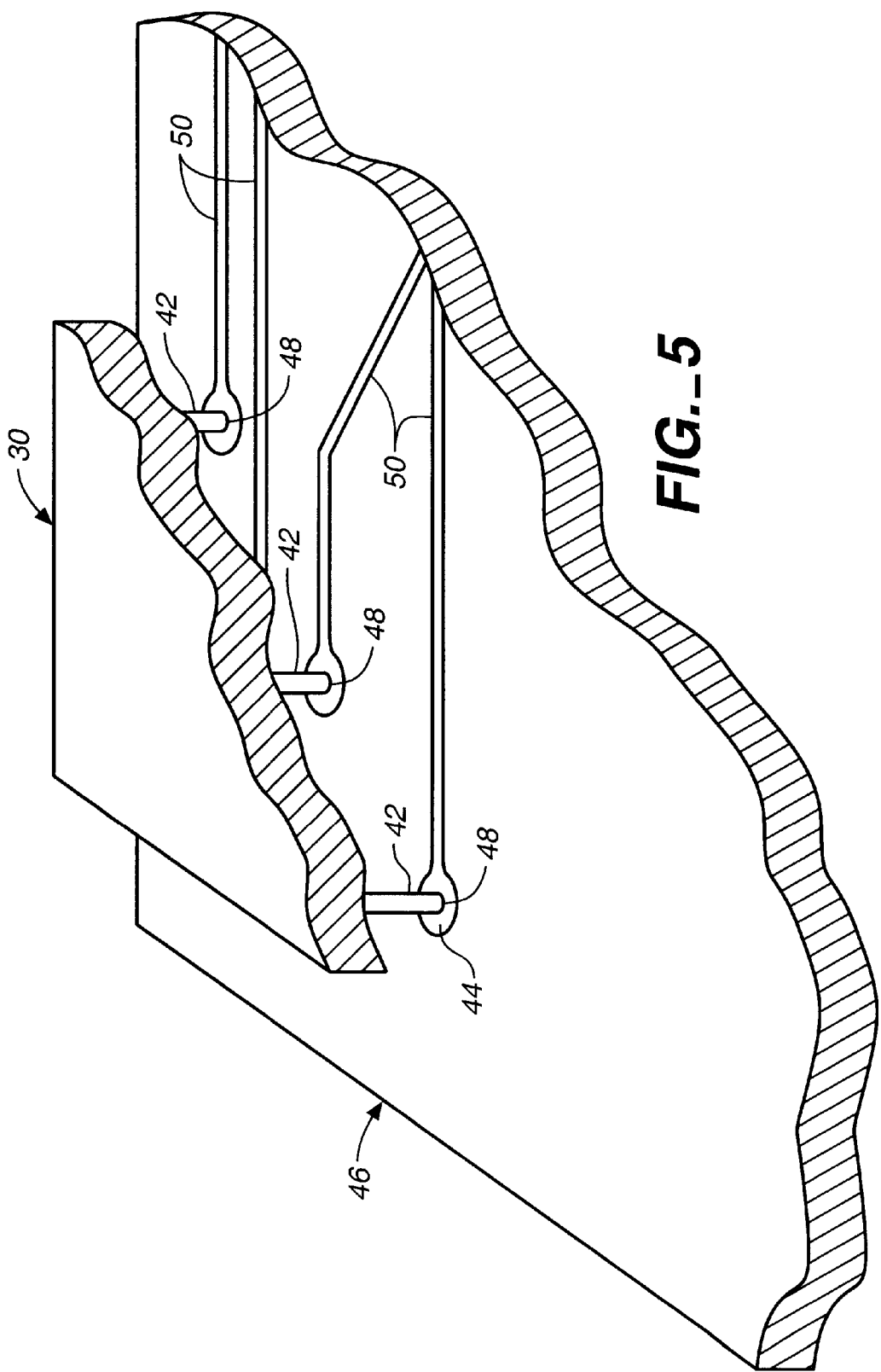
FIG._5

OVER-VOLTAGE PROTECTION FOR ELECTRONIC CIRCUITS

This application is a divisional of application Ser. No. 09/548,904, filed on Apr. 13, 2000.

BACKGROUND OF THE INVENTION

1. Field of the Invention

The present invention relates generally to variable voltage protection devices used to protect electronic circuits from overvoltage transients caused by lightning, electromagnetic pulses, electrostatic discharges, ground loop induced transients, or inductive power surges.

2. Description of Related Art

It is generally known that the magnitude of an electrical voltage allowed to be applied to an integrated circuit package is rather limited since the physical size of the integrated circuit package is fairly small. When the integrated circuit package is not being used, for example, in storage or handling, the external leads or pins thereof are susceptible to the build-up of a static charge thereon. If the integrated circuit package happens to come in contact with a ground potential, the accumulated static charges will flow to ground. Such static discharge can be of a catastrophic nature with sufficient energy to cause damage or even destroy the semiconductor element or chip mounted within the integrated circuit package.

In order to protect the semiconductor chip in the integrated circuit package from being destroyed when such static discharges or other overvoltages occur, there has been provided in the prior art a protection element such as a transistor element or a p–n junction applied with a reverse bias, which breaks down when the semiconductor chip encounters an unexpectedly high voltage.

Other protection schemes, such as that disclosed in U.S. patent Ser. No. 4,928,199 to Diaz, et al., use a circuit protection device incorporated into an IC package. In the Diaz, et al. patent the device, referred to as a threshold circuit protection device, is disposed against the conductive pads of the IC package and operates to ground excess current resulting from potentially damaging voltage transients encountered by the IC-package combination. The Diaz, et al. device itself is annular in shape and comprised of a glass layer and a conducting layer connected to ground. Voltages exceeding a threshold level cause the glass layer to conduct, thereby providing a direct pathway for current away from the sensitive circuitry of the IC. The glass layer operates as an insulator under normal voltages below the threshold voltage level.

In U.S. patent Ser. No. 5,796,570 to Mekdhanasam, et al., a circuit board is provided with protection against electrostatic discharge. The circuit board includes a plurality of interconnect traces and an electrically conductive ground plane separated from each other by a gap containing a resistive discharge protection material. The material serves to insulate the interconnect traces from the ground plane during normal operation, but becomes conductive in the presence of voltages above a threshold voltage.

Various overvoltage protection materials have been used in the prior art, such as the glass material used in the Diaz, et al. patent. These materials are also known as nonlinear resistance materials and are herein referred to as variable voltage materials. In operation, the variable voltage material initially has high electrical resistance. When the circuit experiences an overvoltage spike, the variable voltage material quickly changes to a low electrical resistance state in order to short the overvoltage to a ground. After the overvoltage has passed, the material immediately reverts back to a high electrical resistance state. The key operational parameters of the variable voltage material are the response time, the clamp voltage, the voltage peak and peak power. The time it takes for the variable voltage material to switch from insulating to conducting is the response time. The voltage at which the variable voltage material limits the voltage surge is called the clamp voltage. In other words, after the material switches to conducting, the material ensures that the integrated circuit chip, for example, will not be subjected to a voltage greater than the clamp voltage. The voltage at which the variable voltage material will switch (under surge conditions) from insulating to conducting is the switch voltage. These materials typically comprise finely divided conductive or semiconductive particles dispersed in an organic resin or other insulating medium. For example, U.S. Pat. No. 3,685,026 (Wakabayashi, et al.), U.S. Pat. No. 4,977,357 (Shrier) and U.S. Pat. No. 4,726,991 (Hyatt et al.) disclose such materials.

Variable voltage materials and components containing variable voltage materials have been incorporated into overvoltage protection devices in a number of ways, including that discussed in U.S. Pat. No. 4,928,199 (Diaz, et al.). Other examples include U.S. Pat. Nos. 5,142,263 and 5,189,387 (both issued to Childers et al.), which disclose a surface mount device which includes a pair of conductive sheets and variable voltage material disposed between the pair of conductive sheets. U.S. Pat. No. 5,246,388 (Collins et al.) is directed to a device having a first set of electrical contacts that interconnect with signal contacts of an electrical connector, a second set of contacts that connect to a ground, and a rigid plastic housing holding the first and second set of contacts so that there is a precise spacing gap to be filled with the overvoltage material. U.S. Pat. No. 5,248,517 (Shrier et al.) discloses painting or printing the variable voltage material onto a substrate so that conformal coating with variable voltage material of large areas and intricate surfaces can be achieved. By directly printing the variable voltage material onto a substrate, the variable voltage material functions as a discrete device or as part of associated circuitry. Finally, U.S. Pat. No. 5,796,570 (Mekdhanasarn, et al.) discloses a circuit board having a plurality of interconnect traces and an electrically conductive ground plane formed on a substrate such that a gap is created between the interconnect traces and the ground plane. The gap contains a resistive electrostatic discharge protection material which insulates the interconnect traces from the ground plane at voltages below a predefined threshold voltage and establishes an electrical connection between the interconnect traces and the conductive plane at voltages above the threshold voltage.

Although the prior art discloses various materials and devices, there is a continuing and long felt need to provide improved cost-effective variable voltage materials and devices. Moreover, as miniaturization of semiconductor integrated circuits increases, the amount of circuit components comprising individual chips has dramatically increased. Accordingly, the number of connections which need to be made with an electronic package housing such a high density of circuit components has increased. The need to protect the dense integrated circuits from overvoltages occurring at any and all of these connections presents unique problems associated with the physical layout of the electronic packages, problems which are not addressed by the prior art. These same problems of physical spacing and materials selection, for example, also figure in the design of the printed circuit boards upon which the IC packages are intended to mount.

SUMMARY OF THE INVENTION

The invention provides an arrangement for protecting sensitive electronic devices such as integrated circuits from voltage transients. In accordance with the invention, the package in which an integrated circuit (IC) is housed is provided with ground bars each adapted for connection to ground and each associated with one or more contact portions serving to electrically connect the IC package (and the IC housed therein) to a confronting exterior circuit such as one disposed on a printed circuit board (PCB). The package itself may house one or more IC chips and may be of the form of a ball grid array (BGA), a pin grid array (PGA), a dual inline package (DIP), a single inline package (SIP) or any similar integrated circuit packaging structure.

The association between the ground bar and the contact portions is in the form of a microgap formed between the ground bar and each contact portion, with the microgap containing therein a variable voltage material, preferably the proprietary material known as SurgX™. The microgap with the variable voltage material provides for electrical communication between the contact portion and the ground bar under controlled conditions, namely when a predetermined threshold voltage is exceeded. Below the threshold, the microgap behaves as an insulator, whereas when a voltage spike due to for example static discharge is presented thereto, a clamping voltage barrier is overcome and the microgap-variable voltage combination behaves as a very low resistance conductor serving to short the contact portion to ground, thereby safely dissipating any excess current.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIG. 1 is a schematic view of a protected IC packaging structure in accordance with the preferred embodiment of the invention;

FIG. 2 is a cross-sectional view taken along line a—a of FIG. 1;

FIG. 3 is a schematic view showing a solder ball mounting arrangement of the protected IC packaging structure in accordance with the invention;

FIG. 4 is a schematic view showing a conductive pin mounting arrangement of the protected IC packaging structure in accordance with the invention; and FIG. 5 is a partial cut-away view the mounting of the protected IC packaging structure 30 in a secondary circuit in accordance with the invention.

DESCRIPTION OF THE PREFERRED EMBODIMENTS

FIGS. 1 and 2 show generally a protected integrated circuit (IC) packaging structure 30 in accordance with the invention, with FIG. 2 being a cross-sectional view taken along line a—a in FIG. 1. The IC packaging structure 30 comprises an electrically insulating substrate 32 formed of any suitable polymer or ceramic material, or other electrically non-conducting material. Formed on substrate 32 is an array of electrically conductive contact portions 34 each being in electrical communication with an I/O pad of one or more IC chips (not shown) associated with the protected IC packaging structure 30. As seen most clearly from FIG. 5, contact portions 34 serve to electrically connect the protected IC packaging structure 30 and the IC chip(s) thereof to an external secondary circuit (not shown), such as may be provided on a printed circuit board (PCB) 46, by mating with corresponding electrically conducting contact regions 49 associated with the external secondary circuit and disposed on the PCB. The packaging structure, and more particularly, the array of conductive portions 34, is preferably arranged in a confronting relationship with associated leads of the secondary circuit. The nature of this mating may be in the form of, but is not limited to, pins extending between contact portions 34 and the conducting regions 49 (Pin Grid Array, or PGA type connection), or conducting balls designed to form soldering points between the contact portions 34 and the conducting regions 49 (Ball Grid Array, or BGA type connection), as further detailed below. In the instance in which pins would be used in a Pin Grid Array arrangement, the pins would extend orthogonally from the plane of the drawing of FIG. 1, in the direction of confronting PCB 46, so as to facilitate a "plug-in" type of mating of the components.

FIGS. 1 and 2 further disclose a grid structure comprised of a plurality of ground bars 36 formed in or on substrate 32. Each ground bar 36 is formed of an electrically conducting material and is associated with a row of contact portions 34, and more specifically, with each contact portion 34 of the row. The material of the ground bars 36 can be any suitable conductor, such as copper or gold, depending on the particular application. The ground bars 36 are in turn collectively connected to ground 37 in a suitable manner, for example via a trace or wire 39.

Disposed between each contact portion 34 and the ground bar 36 associated therewith are microgaps 38. The microgaps 38 are preferably filled with a variable voltage material 40, such as for example SurgX™, whose composition is described below. The microgap-variable voltage material combination operates to electrically isolate the ground bar 36 from the associated contact portions 34 by serving as an electrical insulator under normal operating conditions. Under high transient voltage conditions, however, the variable voltage material 40 converts to a low resistance, conducting material which channels current from the affected contact portion(s) 34 harmlessly to ground 37, via ground bar 36 and trace 39.

Microgaps 38 may alternatively be filled with a vacuum, in which case they would be capped to hermetically seal in the vacuum region, or they may be filled with air, in which case they may be covered with tape or capped for protection from the environment, or they may be filled with any variable voltage material such as will impede the flow of electrical current from between the ground bar 36 and the associated contact portion 34 until there is an overvoltage condition. The variable voltage material exhibits the desired protection characteristics as a function of the material used and/or the dimensions of the microgap 38. Generally, the wider the microgap 38, the higher the clamp voltage, and those having ordinary skill in the art will recognize that the specific nature of the materials and the dimensions used will depend on the particular application.

Construction of the protected IC packaging structure 30 in accordance with the invention will generally follow known techniques for fabricating IC packages of the ball grid array (BGA), pin grid array (PGA), dual inline package (DIP), single inline package (SIP) type or similar integrated circuit packaging structures. The microgaps (38) themselves are formed preferably by laser cutting or photoresist thin film processing, although other processes, such as screen printing, can be used.

FIGS. 3 and 4 show cross-sectional views of two arrangements for connecting the protected IC packaging structure 30 to an external secondary circuit (not shown). In FIG. 3, solder balls 44 are used, with each ball corresponding to an associated contact portion 34 and serving to bind, through known soldering methods, the protected IC packaging structure 30 to the secondary circuit. In the arrangement depicted in FIG. 4 the same function is achieved using conducting pins 42, with the conducting pins 42 each being in electrical contact with a corresponding contact portion 34 by for example passing through the contact portion 34 and into the substrate 32. The protected IC packaging structure 30 is then mounted into the secondary circuit as shown in FIG. 5, which may itself be formed on for example a printed circuit board (PCB) 46. This mounting is effected by insertion of the pins 42 into appropriate holes 48 in contact regions 49 disposed in the PCB 46, the holes 48 and/or contact regions 49 having electrically conducting portions which come into contact with pins 42 to thereby complete electrical circuits, via traces 50, between the pins 42 and circuit elements (not shown) of the secondary circuit. Soldering of the pins 42 in place in holes 48 of the secondary circuit may then optionally be implemented to achieve a more secure electrical and mechanical bond. It will be appreciated that the alternative arrangement in which the pins are disposed on the PCB of the secondary circuit and protrude therefrom into the confronting array of contact portions 34 of packaging structure 30 can be readily deployed without departure from the spirit and scope of the invention.

The materials chosen for the protected IC packaging structure 30 of the invention can be selected as follows. Substrate 32 may be formed of for example bismaleimide triazine, fire retardant grade 4 laminate printed wiring board material, polyimide or high temperature epoxy, etc. Contact portions 34 and ground bars 36 may be formed of for example copper, nickel-plated copper, brass, beryllium copper, gold, etc.

Variable voltage materials are known, and the variable voltage material 40 can be selected from any of the prior art arrangements exhibiting the required characteristics as discussed above. A preferred variable voltage material is a product referred to commercially as SurgX™ and manufactured by the SurgX Corporation. Having various forms, SurgX™ can be comprised of one or more layers of a neat dielectric polymer, glass, ceramic or composites thereof, with these terms referring to a polymeric, glass, ceramic or composite thereof which can act as a dielectric or insulating material under the normal voltage and current conditions of intended use and which is unfilled, i.e., does not contain conductive or semiconductive particles such as those typically used in binders or otherwise associated with variable voltage protection materials of the prior art. However, "neat dielectric polymer, glass, ceramic or composites thereof" includes polymeric, glass, ceramic or composites thereof which fulfill the above criteria, but which may contain or have added to them insulative or inert particles or materials that are inactive or do not interfere with the desired dielectric/over-voltage protection properties of the polymer or glass layer.

The polymers and glasses useful in this aspect of the invention can be selected from polymers known in the art to be useful as binders in conventional non-linear resistance materials to the extent that such polymers are known to have high resistance to tracking and high resistance to arcing. In addition, other polymers and glasses not previously suitable for or used as such binders are also useful if they exhibit sufficient dielectric properties, sufficient resistance to tracking and sufficient resistance to arcing under the operating conditions selected for a device according to this invention.

In general, the types of polymers useful in the present invention include silicone rubber and elastomer, natural rubber, organopolysiloxane, polyethylene, polypropylene, polystyrene, poly(methyl methacrylate), polyacrylonitrile, polyacetal, polycarbonate, polyamide, polyester, phenol-formaldehyde resin, epoxy resin, alkyd resin, polyurethane, polyamide, phenoxy resin, polysulfide resin, polyphenylene oxide resin, polyvinyl chloride, fluoropolymer and chlorofluoropolymer. These and other useful polymers can be used by themselves or can include various substituent groups and can be mixtures, blends or copolymers thereof, wherein the final polymer is selected in accordance with the criteria described above. A particularly preferred polymer is a conventional and commercially available General Electric "615" silicone, and it is also particularly preferred to cure this polymer for about 15 minutes at about 200° C. to obtain properties better suited for use in this invention.

The glass materials useful in this invention are likewise glass materials which have been used as binders in variable voltage materials such as sodium silicate. The dielectric glass, such as a sodium silicate is generally useful in this invention in thicknesses similar to those outlined above for the polymer materials.

As will be appreciated by one skilled in the art, various dielectric polymers and glasses can be used in this invention following the teachings contained herein with respect to the microgap 38 in which is disposed the neat dielectric polymer, glass, ceramic or composites thereof to exhibit the desired clamping voltage and other desired properties. Examples of polymers which can be employed in this invention include those disclosed in U.S. Pat. Nos. 4,298,416, 4,483,973, 4,499,234, 4,514,529, 4,523,001, 4,554,338, 4,563,498, 4,580,794, the disclosures of which are incorporated herein by reference. As indicated, other resins may be selected for use in accordance with this invention.

The above described neat dielectric polymer, glass, ceramic or composites thereof layer can be used in combination with a non-linear resistance material to modify and enhance certain properties and performance characteristics of the non-linear resistance. As referred to as part of this invention, the non-linear resistance material can be a conventional variable voltage material which comprises a binder containing conductive particles and/or semiconductive particles and/or insulative particles. As used in this invention, the non-linear resistance material may also include other novel, modified and improved non-linear resistance materials or over-voltage components such as disclosed in this specification.

The non-linear resistance material used can be any non-linear resistance material known in the art, for example those disclosed in either U.S. Pat. No. 4,977,357 (Shrier) or U.S. Pat. No. 4,726,991 (Hyatt et al.), which are incorporated herein by reference. Generally, the non-linear resistance material comprises a binder and closely spaced conductive particles homogeneously distributed in the binder and spaced to provide electrical conduction. In addition, various material such as that disclosed in U.S. Pat. No. 4,103,274 (Burgess et al.) can be used in accordance with the present invention.

While the details of the invention are exemplarily described in terms of the packaging structure of an electronic circuit such as an IC chip, it will be recognized that the invention can be practiced with other electronic circuit structures. For example, the ground bars, microgaps and associated contact portions can be formed as discrete features of any circuit in which it is desired to protect components from overvoltage transients, with the microgaps serving to harmlessly channel excess current from the contact portions, which are in electrical communication with sensitive components of such a circuit, to the appropriately grounded ground bars in the manner described above.

The above are exemplary modes of carrying out the invention and are not intended to be limiting. It will be apparent to those-skilled in the art that modifications thereto can be made without departure from the spirit and scope of the invention as set forth in the following claims.

What is claimed is:

1. A method for protecting an electronic circuit mounted on an electrically insulating substrate, the electronic circuit being arranged in a packaging structure for connection to a secondary circuit, the method comprising:

forming a two-dimensional array of electrically conductive contact portions on the substrate, the contact portions being arranged in a confronting relationship with associated contact regions of the secondary circuit and being adapted for electrical communication with the electronic circuit through said contact regions;

forming one or more electrically conductive ground bars on the substrate, each ground bar being associated with one or more contact portions of the array; and forming a plurality of microgaps on the substrate, each microgap corresponding to an associated contact portion and comprising an electrical connection between the associated contact portion and an associated ground bar at voltages exceeding a predetermined threshold voltage and an electrical barrier between the corresponding contact portion and the associated ground bar at voltages below the predetermined threshold voltage.

2. The method of claim 1, wherein the microgaps are formed by laser cutting.

3. The method of claim 1, wherein the microgaps are formed by photoresist thin film processing.

4. The method of claim 1, wherein the microgaps are formed by screen printing.

5. The method of claim 1, wherein the microgaps are filled with a variable voltage material.

6. The method of claim 5, wherein the variable voltage material comprises SurgX™.

7. The method of claim 5, wherein the variable voltage material comprises air.

8. The method of claim 1, wherein the array of electrically conductive contact portions is arranged in one or more rows each associated with a corresponding ground bar.

* * * * *